(12) United States Patent
Ji et al.

(10) Patent No.: US 9,796,577 B2
(45) Date of Patent: Oct. 24, 2017

(54) MICRO-SENSOR BODY AND METHOD FOR MANUFACTURING THE SAME, AS WELL AS MICRO-SENSOR

(71) Applicant: Boe Technology Group Co., Ltd., Beijing (CN)

(72) Inventors: Chunyan Ji, Beijing (CN); Tian Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 14/778,721

(22) PCT Filed: Apr. 15, 2015

(86) PCT No.: PCT/CN2015/076636
§ 371 (c)(1),
(2) Date: Sep. 21, 2015

(87) PCT Pub. No.: WO2016/065857
PCT Pub. Date: May 6, 2016

(65) Prior Publication Data
US 2016/0052775 A1   Feb. 25, 2016

(30) Foreign Application Priority Data
Oct. 30, 2014   (CN) .......................... 2014 1 0601932

(51) Int. Cl.
*B81B 3/00*   (2006.01)
*B81C 1/00*   (2006.01)
(Continued)

(52) U.S. Cl.
CPC ........ *B81B 3/0021* (2013.01); *B81C 1/00158* (2013.01); *C23C 14/0605* (2013.01);
(Continued)

(58) Field of Classification Search
CPC .............. B81B 3/0021; B81C 1/00158; C23C 14/0605; C23C 14/0617; C23C 14/14;
(Continued)

(56) References Cited

U.S. PATENT DOCUMENTS

| | | |
|---|---|---|
| 2011/0248219 A1 | 10/2011 | Zagdoun et al. |
| 2013/0100073 A1* | 4/2013 | Wang ...................... G06F 3/044 |
| | | 345/174 |
| 2014/0285224 A1 | 9/2014 | Albuschies |

FOREIGN PATENT DOCUMENTS

| | | |
|---|---|---|
| CN | 101239712 | 8/2008 |
| CN | 102275866 | 12/2011 |

(Continued)

OTHER PUBLICATIONS

International Search Report and Written Opinion from PCT/CN2015/076636 dated Jul. 29, 2015.
(Continued)

*Primary Examiner* — Hezron E Williams
*Assistant Examiner* — David Z Huang
(74) *Attorney, Agent, or Firm* — Calfee, Halter & Griswold LLP

(57) ABSTRACT

The present disclosure relates to the field of sensor manufacturing technology, particularly discloses a method for manufacturing a micro-sensor body, comprising the steps of S1: applying a wet colloidal material on a substrate to form a colloidal layer, and covering a layer of one-dimensional nanowire film on the surface of the colloidal layer to form a sensor embryo; S2: drying the colloidal layer of the sensor embryo to an extent that the colloidal layer cracks into a plurality of colloidal islands, a portion of the one-dimensional nanowire film contracting into a contraction diaphragm adhered to the surface of the colloidal islands while the other portion of the one-dimensional nanowire film being stretched into a connection structure connected
(Continued)

between the adjacent contraction diaphragms. By the method for manufacturing a micro-sensor body of the present disclosure, the contraction diaphragms and connection structures formed by stretching the one-dimensional nanowire film are connected stably, which enhances the stability of the sensor devices; and the cracking manner renders it easy to obtain a large-scale of sensor bodies with connection structure arrays in stable suspension.

16 Claims, 2 Drawing Sheets

(51) Int. Cl.
  *C23C 14/06*  (2006.01)
  *C23C 14/14*  (2006.01)
  *C23C 14/34*  (2006.01)
  *G01F 1/56*  (2006.01)
  *G01J 1/42*  (2006.01)
  *H02S 20/00*  (2014.01)
  *F24J 2/52*  (2006.01)

(52) U.S. Cl.
  CPC .......... *C23C 14/0617* (2013.01); *C23C 14/14* (2013.01); *C23C 14/34* (2013.01); *F24J 2/5203* (2013.01); *F24J 2/5258* (2013.01); *G01F 1/56* (2013.01); *G01J 1/42* (2013.01); *H02S 20/00* (2013.01); *B81B 2203/0127* (2013.01); *B81C 2201/013* (2013.01); *B81C 2201/0176* (2013.01); *B81C 2201/0181* (2013.01); *F24J 2002/5215* (2013.01); *F24J 2002/5226* (2013.01); *F24J 2002/5284* (2013.01); *Y02E 10/47* (2013.01); *Y02E 10/50* (2013.01)

(58) Field of Classification Search
  CPC ........ C23C 14/34; F24J 2/5203; F24J 2/5258; G01F 1/56; G01J 1/42; H02S 20/00
  See application file for complete search history.

(56) References Cited

FOREIGN PATENT DOCUMENTS

| | | |
|---|---|---|
| CN | 102815666 | 12/2012 |
| CN | 103675015 | 3/2014 |
| CN | 103698846 | 4/2014 |
| CN | 103708411 | 4/2014 |
| CN | 103840075 | 6/2014 |
| CN | 104045054 | 9/2014 |
| CN | 104112544 | 10/2014 |
| CN | 104296799 | 1/2015 |
| DE | 102011107649 | 1/2013 |
| EP | 480471 | 4/1992 |
| JP | H09126833 | 5/1997 |
| TW | 201108252 | 3/2011 |

OTHER PUBLICATIONS

Office action from Chinese Application No. 201410601932.1 dated Mar. 8, 2016.

* cited by examiner

MICRO-SENSOR BODY AND METHOD FOR MANUFACTURING THE SAME, AS WELL AS MICRO-SENSOR

RELATED APPLICATIONS

The present application is the U.S. national phase entry of PCT/CN2015/076636, with an international filing date of Apr. 15, 2015, which claims the benefit of Chinese Patent Application No. 201410601932.1 filed Oct. 30, 2014, the entire disclosures of which are incorporated herein by reference.

TECHNICAL FIELD

This disclosure relates to the field of sensor manufacturing technology, particularly to a micro-sensor body and a method for manufacturing the same, as well as a micro-sensor.

BACKGROUND ART

In recent years, with the rapid development of micro- and nano-technology, microvalue measurement in a micro-scale environment has gradually been attached more and more importance. A micro-sensor made on the basis of micro-electromechanical system technologies, as an important testing tool, has become widely used in the aspects of micro-robots, micro assembly system and the like.

At present, devices made on the basis of carbon nanotubes and metal/semiconductor nanowire mainly include electronic devices and sensors, wherein a sensor body is mass-assembled of nanomaterials in one-dimensional orientation. FIG. 1 shows a sensor body made of carbon nanotubes in the prior art, and the manufacturing method thereof is to machine a plurality of projections 2 on a substrate 1, adhere an electrode sheet 3 to the upper surface of the projection 2, connect a plurality of resonant beams between the electrode sheets 3 on the adjacent projections 2, the resonant beams being generally made of nanotubes 4 suspended over a groove between the projections 2; or arrange a plurality of electrode sheets 3 on the substrate 1 firstly, connect a plurality of nanotubes 4 between the electrode sheets 3 and then etch the groove under the nanotubes 4 by means of etching and the like. However, in the sensor body manufactured by such a method, it is possible to slip off for the nanotubes 4 because the ends of nanotubes 4 made of one-dimensional nanomaterials are adhered only by a superficial oxide layer or metal electrodes, such that it is not enough to excite resonance or carry heavy loads, which renders the structure of the device unstable. In addition, it is more difficult to manufacture a large-scale of stable sensor bodies with resonant beam arrays in suspension by the prior-art method for manufacturing sensor bodies.

SUMMARY OF THE INVENTION

To overcome the above-mentioned problems and defects in the prior art, the present disclosure provides a micro-sensor body and a method for manufacturing the same so as to enhance stability of sensor devices and facilitate to obtain a large-scale of stable sensor bodies with connection structure arrays in suspension.

According to the first aspect of the present disclosure, there is provided a method for manufacturing a micro-sensor body, which comprises the steps of:

S1: applying a wet colloidal material on a substrate to form a colloidal layer, and covering a layer of one-dimensional nanowire film on the surface of the colloidal layer to form a sensor embryo;

S2: drying the colloidal layer of the sensor embryo so that the colloidal layer cracks into a plurality of colloidal islands, and that a portion of the one-dimensional nanowire film contracts into a contraction diaphragm adhered to the surface of the colloidal islands while the other portion of the one-dimensional nanowire film being stretched into a connection structure connected between the adjacent contraction diaphragms.

In an embodiment of the method for manufacturing a micro-sensor body according to the present disclosure, the contraction diaphragms and connection structures are made by stretching the one-dimensional nanowire film and are stably connected between the two, which enhances the stability of sensor devices; and the use of cracking method facilitates to obtain of a large-scale of stable sensor bodies with connection structure arrays in suspension. Further, the selection of one-dimensional nanowire films and colloidal materials to use makes it possible to produce optical, temperature and airflow sensors.

In an embodiment of the method for manufacturing a micro-sensor body according to the present disclosure, the step S2 comprises: placing the sensor embryo in a dryer, adjusting a drying temperature and a drying pressure so as to keep the drying temperature at 0~260° C. and the drying pressure at 0~10 MPa.

In an embodiment of the method for manufacturing a micro-sensor body according to the present disclosure, the method further comprises step S10 of etching a required groove pattern on the surface of the substrate, which is prior to step S1.

In an embodiment of the method for manufacturing a micro-sensor body according to the present disclosure, the wet colloidal material may include colloidal particles and solvent. Furthermore, the colloidal particles can be made of a wide band-gap semiconductor material that can be titanium dioxide, bismuth sulfide or cadmium sulfide. Additionally, the solvent may be an organic solvent.

In an embodiment of the method for manufacturing a micro-sensor body according to the present disclosure, the one-dimensional nanowire film can be made of a fibrous, tubular metallic material or a semiconductor material, wherein the semiconductor material can be carbon nanofibers, nano carbon ribbons, carbon nanotubes or GaP, InP semiconductor nanowires; and the metallic material can be platinum or silver metallic nanowires. Moreover, the one-dimensional nanowire film can be made by a chemical vapor phase reaction, vacuum evaporation, sputtering, ion plating or nano semiconductor growth process.

According to the second aspect of the present disclosure, there is provided a micro-sensor body made by the aforementioned method for manufacturing a micro-sensor body according to the present disclosure, which comprises a substrate; a plurality of colloidal islands attached to the substrate; and a triggering net attached to the plurality of colloidal islands, wherein the triggering net includes a plurality of contraction diaphragms adhered to the surface of the colloidal islands and connection structures connected between the adjacent contraction diaphragms.

In an embodiment of the micro-sensor body according to the present disclosure, the triggering web is made of a fibrous, tubular metallic material or a semiconductor material.

In an embodiment of the micro-sensor body according to the present disclosure, the colloidal islands are made of titanium dioxide, bismuth sulfide, or cadmium sulfide material.

In an embodiment of the micro-sensor body according to the present disclosure, the substrate is a silicon wafer, a glass plate or a printed circuit board.

In an embodiment of the micro-sensor body according to the present disclosure, the substrate is provided with a groove pattern.

According to the third aspect of the present disclosure, there is provided a micro-sensor which comprises the aforementioned micro-sensor body according to the present disclosure.

Figure 1:
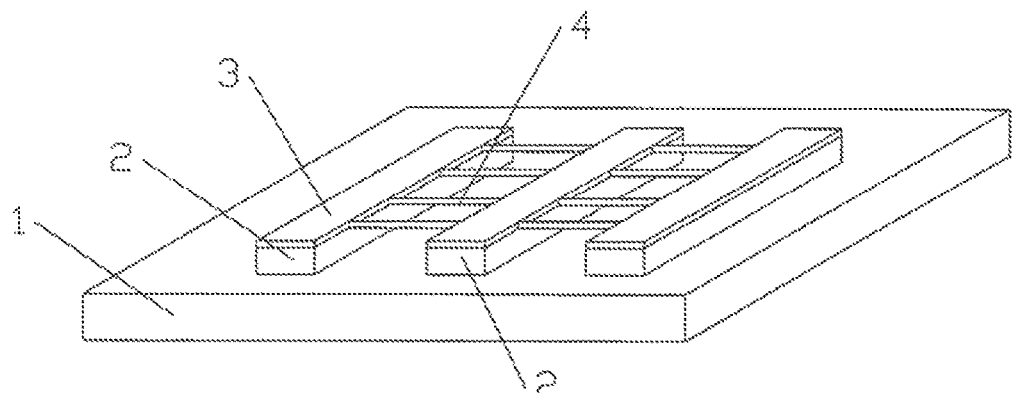
FIG. 1 is a spatial structural schematic view of a prior art micro-sensor body.

REFERENCE SIGNS 1 substrate; 2 projection; 3 electrode sheet; 4 nanotube; 10 a substrate; 11 groove; 20 colloidal layer; 21 colloid island; 30 one-dimensional nanowire film; 31 triggering net; 32: contraction diaphragm; 33 connection structure.

DETAILED DESCRIPTION OF THE INVENTION

The specific implementation of the present disclosure will be described in detail with reference to the drawings and embodiments. The following embodiments are only used to illustrate the present disclosure but are not intended to limit the scope of the disclosure.

Embodiment 1

The method for manufacturing a micro-sensor body according to embodiment 1 of the present disclosure comprises the steps of:

step S1: applying a wet colloidal material on a smooth substrate 10 to form a colloidal layer 20, and covering a layer of one-dimensional nanowire film 30 on the surface of the colloidal layer 20 to form a sensor embryo;

step S2: drying the colloidal layer 20 of the sensor embryo so that the colloidal layer 20 cracks into a plurality of colloidal islands 21, a portion of the one-dimensional nanowire film 30 contracts into a contraction diaphragm 32 adhered to the surface of the colloidal islands 21 while the other portion of the one-dimensional nanowire film 30 being stretched into a connection structure 33 connected between the adjacent contraction diaphragms 32 so as to form a sensor body.

Figure 2:
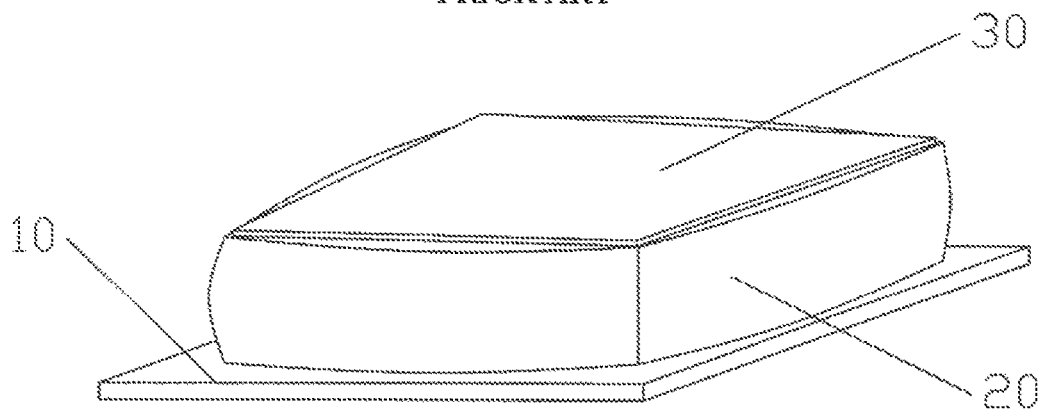
FIG. 2 is a schematic view of a sensor embryo formed in a method for manufacturing a micro-sensor body according to embodiment 1 of the present disclosure.

FIG. 2 is a schematic view of a sensor embryo formed by step S1 of a method for manufacturing a micro-sensor body according to embodiment 1 of the present disclosure. With reference to FIG. 2, in the step S1, the substrate 10 can be a silicon wafer, a glass plate or a printed circuit board, and the upper surface of the substrate 10 is a smooth surface, on which the wet colloidal material is applied to form the colloidal layer 20, and a full and flat piece of one-dimensional nanowire film 30 is laid on the surface of the colloidal layer 20 to form the sensor embryo. The aforementioned wet colloidal material can be made of any colloidal material that cracks into pieces after drying. Preferably, the wet colloidal material includes colloidal particles and a solvent. In this embodiment, the colloidal particles can be mixed with the solvent to form a wet colloidal material after being soaked, wherein the colloidal particles can be made of a wide band-gap semiconductor material, such as titanium dioxide, bismuth sulfide or cadmium sulfide, and the solvent may be made mlusing an organic solvent, such as methanol, ethanol, isopropanol and so on. The one-dimensional nanowire film 30 can be made of a fibrous, tubular metallic material or a semiconductor material. Specifically, the semiconductor material is carbon nanofibers, nano carbon ribbons, carbon nanotubes, or GaP, InP semiconductor nanowires; the metallic material is platinum, silver metallic nanowires. In this example, the one-dimensional nanowire film 30 can be made of carbon nanotubes material by a chemical vapor phase reaction, vacuum evaporation, sputtering, hydrothermal synthesis, ion plating or nano semiconductor growth process.

Figure 3:
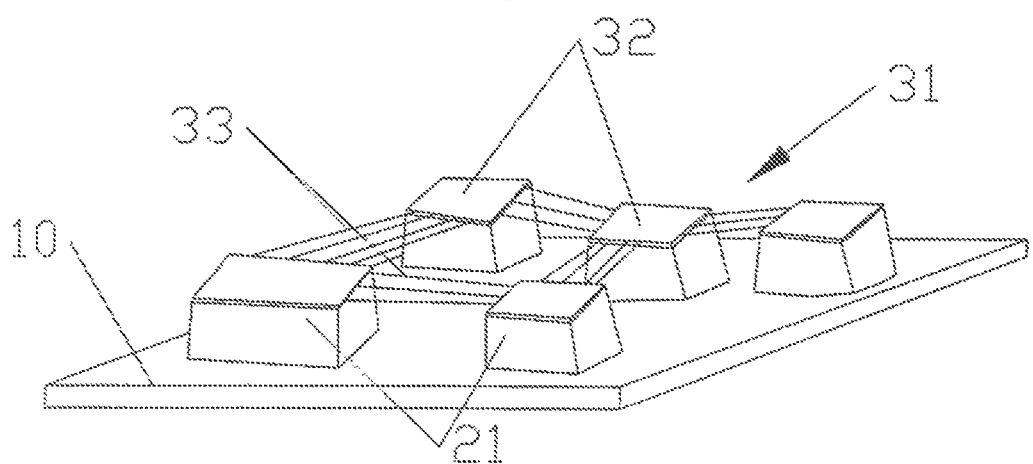
FIG. 3 is a schematic view of a micro-sensor body made by a method for manufacturing a micro-sensor body according to embodiment 1 of the present disclosure.

FIG. 3 is a schematic view of a micro-sensor body made by a method for manufacturing a micro-sensor body according to embodiment 1 of the present disclosure. In the step S2, the colloidal layer 20 of the sensor embryo can be dried naturally or in a dryer. Specifically, the drying process in the step S2 is conducted in the following steps: placing the sensor embryo in a dryer, adjusting a drying temperature and a drying pressure so as to keep the drying temperature at 0~260° C. and the drying pressure at 0~10 MPa, and keeping drying for 2 to 5 hours. During the drying process, the organic solvent in the wet colloidal material can infiltrate into the one-dimensional nanowire film 30 and permeate into its net. When the solvent volatilizes, the colloidal layer 20 then cracks into many small pieces, each of which continuing contracting to form a colloidal island 21. During the cracking process of the colloidal layer 20, a portion of the one-dimensional nanowire film 30 on the surface of the colloidal layer 20 is adhered to the surface of the small pieces, and with the contraction of the small pieces, contracts into contraction diaphragm 32 adhered to the surface of the colloidal islands 21. The other portion of the one-dimensional nanowire film 30 is connected between the adjacent small pieces and stretched into a connection structure 33 under the stretch effect due to contracting of the small pieces. The connection structure 33 is connected between the adjacent contraction diaphragms 32 and suspended between the colloidal islands 21. As shown in FIG. 3, the entire one-dimensional nanowire film 30 is cracked a triggering web 31 including a plurality of contraction diaphragms 32 and connection structures 33.

The micro-sensor body produced by the aforementioned steps S1 and S2 has a plurality of contraction diaphragms 32 and when in use, the contraction diaphragms 32 on the adjacent colloidal islands 21 can be connected to serve as a sensor body, or the contraction diaphragms 32 on both ends of the entire triggering web 31 (namely, both ends of the edge of the entire piece of the colloidal islands) can be connected to serve as a sensor body.

Under different usage conditions, it is required to adjust the width of the groove between the colloidal islands 21, which can be done by adjusting the thickness of the one-dimensional nanowire film 30. The thickness of the one-dimensional nanowire film 30 shall be within a suitable range, but it can neither be assembled in certain orientation if being over-thick, nor form an array if being over-thin. Generally, the thickness ratio of the one-dimensional nanowire film 30 to the colloidal layer 20 is 1/30 to 1/200. If the suspended arrays of the connection structure 33 have an overlarge density, there might be a shielding effect generated therebetween, which reduces the field enhancement factor. If the connection structures 33 are over sparse, the field emission area is small so as to not be conductive to the enhancing of the field emission currents. Thus, it is needed to control the cracking degree of the colloidal layer 20 by adjusting the parameters, such as the thickness of the one-dimensional nanowire film 30, the drying temperature and the drying pressure and the like, so as to regulate the distance between the colloidal islands 21.

Embodiment 2

The present embodiment 2 is substantially the same as embodiment 1, except in that: prior to step S1, embodiment 2 of the present disclosure further comprises step S10 of etching a desired groove pattern on the surface of the substrate 10 beforehand.

Figure 4:
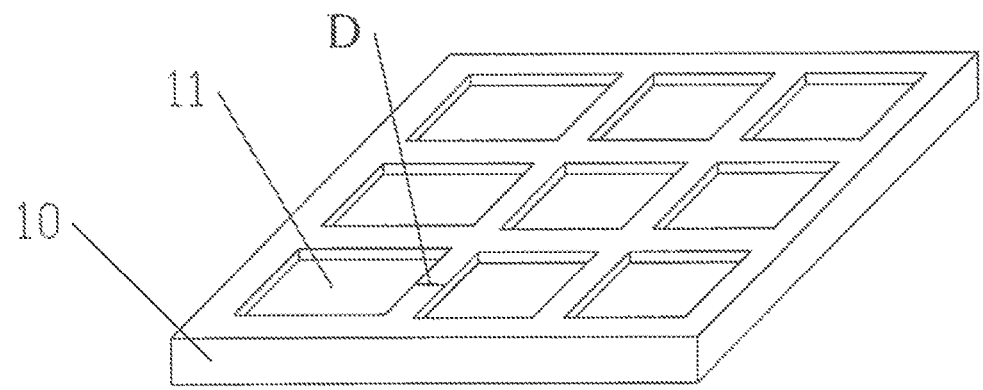
FIG. 4 is a schematic view of a substrate formed by a method for manufacturing a micro-sensor body according to embodiment 2 of the present disclosure.

FIG. 4 shows the substrate formed by the step S10 of the method for manufacturing the micro-sensor body according to the embodiment 2 of the present disclosure. As shown in FIG. 4, nine grooves 11 are etched on the surface of the substrate 10 with the distance D between adjacent grooves. Then, in the embodiment 2, perform the step S1 of the method for manufacturing the micro-sensor according to the embodiment 1 of the present disclosure, namely, applying a colloidal material on the substrate 10 to form the colloidal layer 20 and then adhering a layer of the one-dimensional nanowire film 30 to the colloidal layer 20 to form the sensor embryo, as shown in FIG. 3.

Figure 5:
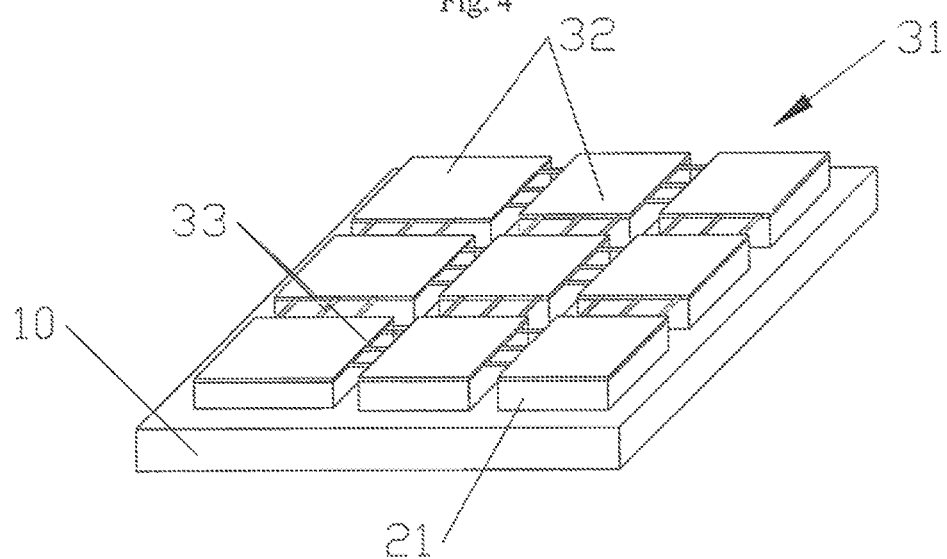
FIG. 5 is a schematic view of a micro-sensor body made by a method for manufacturing a micro-sensor body according to embodiment 2 of the present disclosure.

FIG. 5 is a schematic view of a micro-sensor body made by a method for manufacturing a micro-sensor body according to embodiment 2 of the present disclosure. In embodiment 2, during the process of drying the embryo, the thicker the colloidal layer 20 on the groove is, the slower the contracting process thereofs is, whereas the other portions contract at a faster pace, so that the colloidal layer 20 cracks along the groove pattern. As shown in FIG. 5, the colloidal layer 20 cracks into nine colloidal islands 21, and the one-dimensional nanowire film 30 cracks into nine contraction diaphragms 32 accordingly.

In the method for manufacturing the micro-sensor body according to embodiment 2 of the present disclosure, the groove pattern is arranged on the surface of the substrate 10 such that the number and positions of the colloidal islands 21 and the distances therebetween can be further controlled, thereby effectively improving the production efficiency and reducing the production cost. The depth of the groove 11 can be very small, preferably a micron or nanometer-scale depth. Meanwhile, the area of the groove 11 shall not be too large so as to avoid the formation of a plurality of cracked colloidal islands 21 in the groove 11. Generally, the critical values of the depth and area of the groove 11 can be decided by the specific material used and the drying environment, for instance, it can be determined through finite times of experiments, which will not be reiterated herein.

In the method for manufacturing the micro-sensor body according to the embodiments (e.g., Embodiments 1 and 2) of the present disclosure, a colloid contracts into the colloidal islands 21 that stretches straightly the disorderly twining one-dimensional nanowire film 30 into the triggering net 31, the triggering net 31 has a plurality of contraction diaphragms 32 and connection structures 33 connected between the contraction diaphragms, the connection structure 33 is suspended over the groove between the colloidal islands 21 and arranged in arrays over the entire substrate 10, thereby guaranteeing the stability of the entire structure. This method renders it possible to mass produce the sensor body with the connection structure arrays in suspension. The solvent of the present disclosure adopts an organic solvent so that the one-dimensional nanowire film 30 can be better infiltrated into the organic solvent and firmly combined with the surface of the colloidal islands 21 after drying.

Moreover, the present disclosure also provides a micro-sensor body manufactured by the above-mentioned method for manufacturing a micro-sensor. As shown in FIG. 3 or 4, the micro-sensor body comprises a substrate 10; a plurality of colloidal islands 21 attached to the substrate 10; and a triggering net 31 attached to the plurality of colloidal islands 21, wherein the triggering net 31 includes a plurality of contraction diaphragms 32 adhered to the surface of the colloidal islands 21 and connection structures 33 connected between the adjacent contraction diaphragms 32.

As stated in the method for manufacturing a micro-sensor body according to an embodiment of the present disclosure, the triggering net 31 is preferably made of a fibrous, tubular metallic material or a semiconductor material. The colloidal islands 21 are preferably made of titanium dioxide, bismuth sulfide, or cadmium sulfide material. The substrate 10 is preferably a silicon wafer, a glass plate or a printed circuit board. In addition, as stated in the step S1 of the method for manufacturing a micro-sensor body according to Embodiment 2 of the present disclosure, preferably, the substrate 10 is provided with a groove pattern, each groove pattern has a plurality of grooves, and each groove has one colloidal island 21 therein, as shown in FIG. 4.

In the micro-sensor body according to an embodiment of the present disclosure, the contraction diaphragm 32 serves as an electrode, the connection structure 33 serves as a resonant beam, the contraction diaphragm 32 and the connection structure 33 are integrated into one integrated structure, and the contraction diaphragm 32 is adhered to the surface of the colloidal island 21, which ensures a good stability.

Moreover, the present disclosure also provides a micro-sensor made by means of the sensor body according to embodiments of the present disclosure. Specifically, according to different materials to be adopted, various types of sensors can be manufactured by applying the method for manufacturing the micro-sensor body according to Embodiment 1 or Embodiment 2.

Optical Sensor

If the one-dimensional nanowire film itself absorbs lights more strongly, then the connection structure certainly has a more strong light response. In contrast, if the one-dimensional nanowire film itself absorbs lights weakly, the colloidal material with strong capacity of light absorption can be used to enhance a light response. A wide band-gap semiconductor material that has a wider absorbing zone in visible light wavebands, such as titanium dioxide, bismuth sulfide, or cadmium sulfide, is preferably selected to produce the colloid. The wide band-gap semiconductor material is made into quantum dots, and the surface effect and quantum size effect of quantum dots enable the nano particles with new optical and electrical characteristics which a body material of the same substance and a single molecule do not have, thereby making it possible to make an optical sensor.

Temperature Sensor

For example, the one-dimensional nanowire film is made of carbon nanotubes, and the colloidal material is made of a common material. When energized, the one-dimensional nano material has a higher axial thermal conductivity, Joule thermal effect leads to resistance change, change of electrical signals transmitted by the triggering net and the change of the real-time response temperature, thereby making it possible to manufacture a temperature sensor.

Airflow Sensor

The one-dimensional nanowire film is made of carbon nanowires. Both ends of the suspended connection structure are connected on the contraction diaphragm that is adhered to the surface of the colloidal islands extremely firm, which can not cause slipping. The suspended connection structure will elastically deform under the action of airflows, and be subject to a strong axial stress during the deformation. When the one-dimensional nano material is stretched, the resistance will be changed to some extent and electrical signals transmitted by the triggering net will be changed accordingly, thereby making it possible to make an airflow sensor.

In summary, by the method for manufacturing a micro-sensor body according to the embodiments of the present disclosure, different materials can be selected and made into various types of micro-sensor bodies and further micro-sensors, or even a composite sensor in response to lights, power and heat.

The foregoing is only preferred embodiments of the present disclosure, and is not intended to limit the present disclosure. Any modifications, equivalent substitutions, or improvements and the like within the spirit and principles of the present disclosure should be included in the scope of the present disclosure.

What is claimed is:

1. A method for manufacturing a micro-sensor body, comprising:
    step S1, comprising:
    applying a wet colloidal material on a substrate to form a colloidal layer;
    applying a layer of one-dimensional nanowire film on the colloidal layer to form a sensor embryo;
    step S2, comprising:
    drying the colloidal layer of the sensor embryo so that the colloidal layer cracks into a plurality of colloidal islands, and so that a first portion of the one-dimensional nanowire film contracts into a contraction diaphragm adhered to a surface of the colloidal islands, and a second portion of the one-dimensional nanowire film is stretched into a connection structure connected between adjacent contraction diaphragms.

2. The method for manufacturing a micro-sensor body according to claim 1, wherein step S2 comprises:
    placing the sensor embryo into a dryer; and
    adjusting a drying temperature and a drying pressure so as to keep the drying temperature at about 260° C. and the drying pressure at about 10 MPa.

3. The method for manufacturing a micro-sensor body according to claim 1, further comprising step S10 prior to step S1, step S10 comprising:
    etching a desired groove pattern on a surface of the substrate.

4. The method for manufacturing a micro-sensor body according to claim 1, wherein the wet colloidal material includes colloidal particles and solvent.

5. The method for manufacturing a micro-sensor body according to claim 4, wherein the colloidal particles are made of a wide band-gap semiconductor material.

6. The method for manufacturing a micro-sensor body according to claim 5, wherein the wide band-gap semiconductor material is selected from the group consisting of titanium dioxide, bismuth sulfide, and cadmium sulfide.

7. The method for manufacturing a micro-sensor body according to claim 4, wherein the solvent is an organic solvent.

8. The method for manufacturing a micro-sensor body according to claim 1, wherein the one-dimensional nanowire film is selected from the group consisting of a fibrous tubular metallic material and a semiconductor material.

9. The method for manufacturing a micro-sensor body according to claim 8, wherein:
    the semiconductor material is selected from the group consisting of carbon nanofibers, nano carbon ribbons, carbon nanotubes, GaP semiconductor nanowires, and InP semiconductor nanowires; and
    the metallic material is selected from the group consisting of platinum metallic nanowires and silver metallic nanowires.

10. The method for manufacturing a micro-sensor body according to claim 1, wherein the one-dimensional nanowire film is made by a chemical vapor phase reaction, vacuum evaporation, sputtering, ion plating or nano semiconductor growth process.

11. A micro-sensor body comprising:
    a substrate;
    a plurality of colloidal islands attached to the substrate; and
    a triggering net attached to the plurality of colloidal islands;
    wherein the triggering net includes:
    a plurality of contraction diaphragms adhered to the colloidal islands; and
    connection structures connected between the adjacent contraction diaphragms.

12. The micro-sensor body according to claim 11, wherein the triggering net is selected from the group consisting of fibrous tubular metallic material and a semiconductor material.

13. The micro-sensor body according to claim 11, wherein the colloidal islands are made of a colloidal material selected from the group consisting of titanium dioxide, bismuth sulfide, and cadmium sulfide.

14. The micro-sensor body according to claim 11, wherein the substrate is selected from the group consisting of a silicon wafer, a glass plate, and a printed circuit board.

15. The micro-sensor body according to claim 11, wherein the substrate is provided with a groove pattern.

16. A micro-sensor, comprising:
    the micro-sensor body according to claim 11; and
    an electrical resistance of the micro-sensor body.

* * * * *